United States Patent [19]

Ferber et al.

[11] 4,096,577
[45] Jun. 20, 1978

[54] THIN FLEXIBLE ELECTRONIC CALCULATOR

[76] Inventors: Leon A. Ferber, 48 Lake Ave.; Richard Pavelle, 3 Fieldstone Dr., both of Woburn, Mass. 01801

[21] Appl. No.: 734,285

[22] Filed: Oct. 20, 1976

Related U.S. Application Data

[63] Continuation-in-part of Ser. No. 555,075, Mar. 3, 1975, abandoned.

[51] Int. Cl.² ........................... G06F 3/02; H05K 1/08
[52] U.S. Cl. ................................ 364/712; 174/68.5; 200/292; 364/708; 364/709
[58] Field of Search ............... 235/156, 152; 200/292; 174/68.5, 117 PC, 117 F; 364/709, 708, 712

[56] References Cited

U.S. PATENT DOCUMENTS

| | | | |
|---|---|---|---|
| 3,699,294 | 10/1972 | Sudduth | 200/292 X |
| 3,819,921 | 6/1974 | Kilby et al. | 235/156 |
| 3,911,234 | 10/1975 | Kotaka | 174/68.5 X |
| 3,920,979 | 11/1975 | Kilby | 235/168 |
| 4,002,892 | 1/1977 | Zielinski | 235/156 |

OTHER PUBLICATIONS

H. A. Goodman et al., "Integrated Packaging for Transparent Elastic Diaphram Switches", IEEE Tech. Disclosure Bulletin, vol. 15, No. 2, Jul. 1972, pp. 544–545.

*Primary Examiner*—David H. Malzahn
*Attorney, Agent, or Firm*—Walter J. Kreske

[57] ABSTRACT

An electronic calculator structure comprised of a flexible printed circuit on a thin flexible dielectric material base to which are fixed a low profile solid state computing and driving elements, a readout register and a low profile flexible diaphram type number and function key structure large enough for finger operation, a P-70 Rayovac class thin battery, and an ON-OFF switch, all coupled together in manner to form a thin flexible calculator structure suitable for many end product uses such as being housed between two layers of thin flexible vinyl to form one side of a thin flexible folder, the other side of which carries a pad or business form such as check book or bank deposit and withdrawal recording form to create thereby a thin, flexible, light, folder type calculator for comfortable pocket storage and ready access for on-the-spot use to solve mathematical problems. In one embodiment the ON-OFF switch has an outwardly projecting member when in the ON position as an obstruction to closing the folder for storage until moved to the OFF position to prevent battery discharge during storage. The calculator structure is as thin as five thirty seconds of an inch, thereby sufficiently thin for incorporation as a separate page in a conventional note book or incorporation in a notebook cover for ready access in business, laboratory or class room.

27 Claims, 24 Drawing Figures

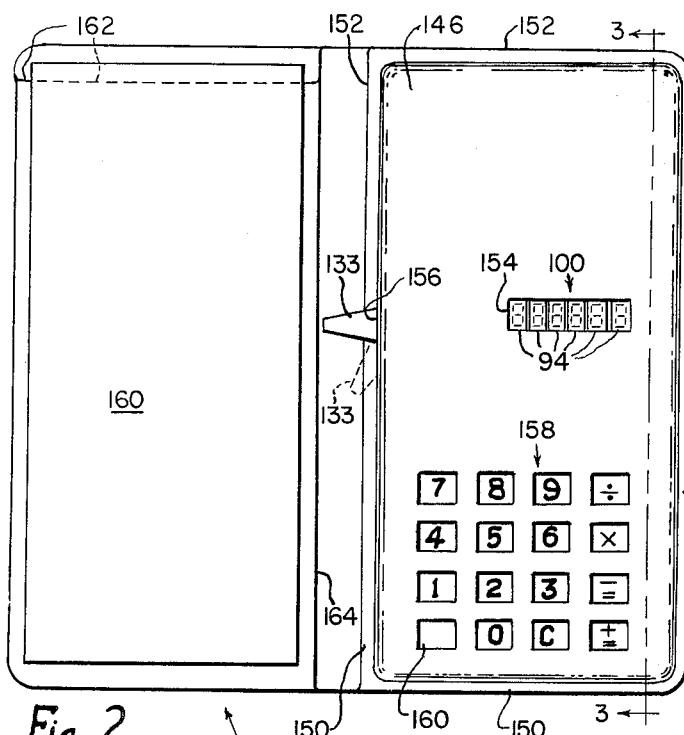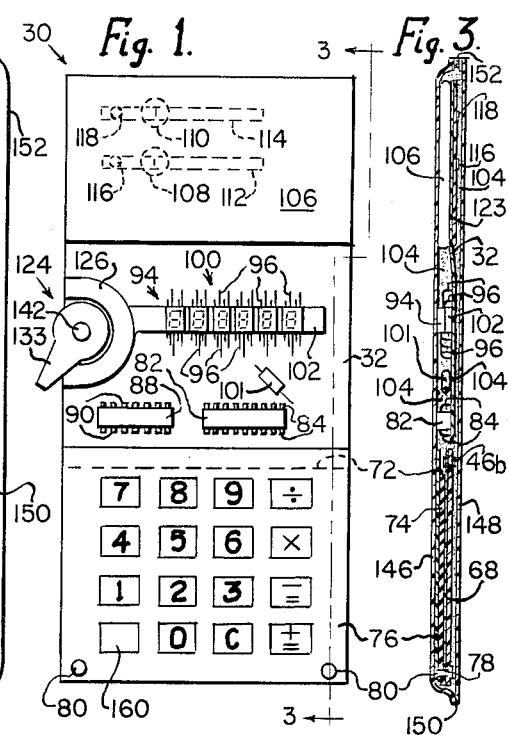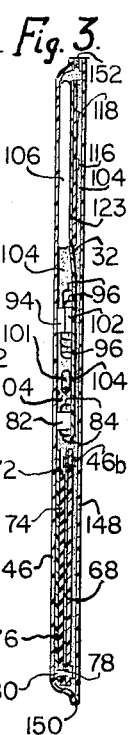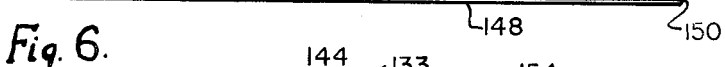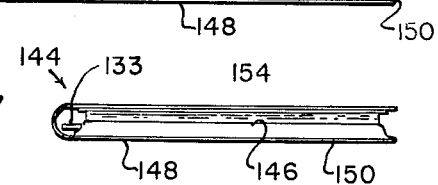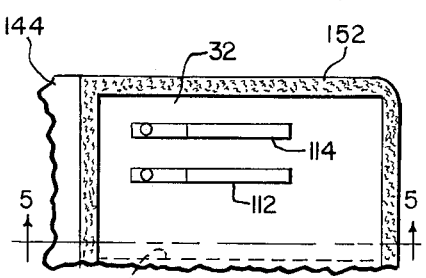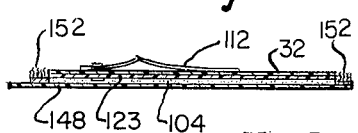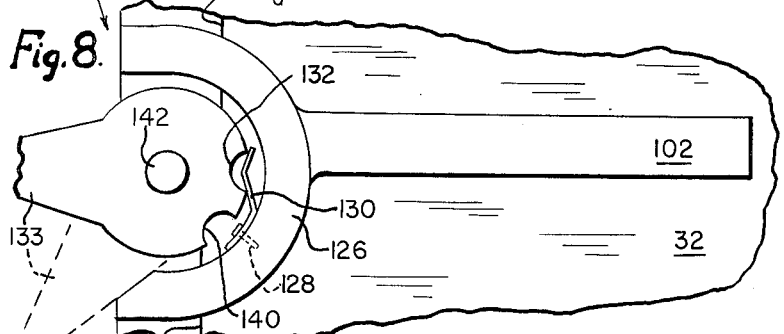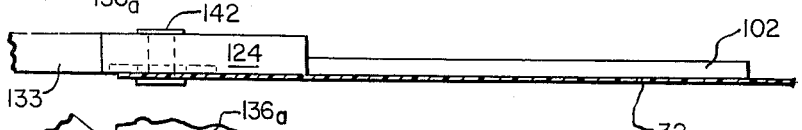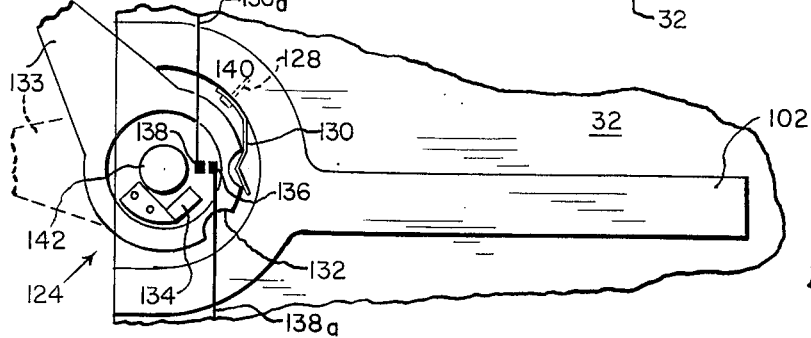

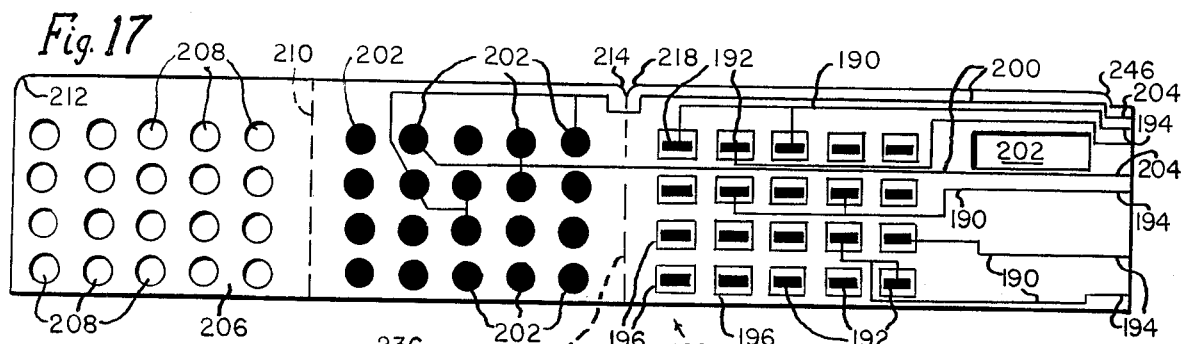
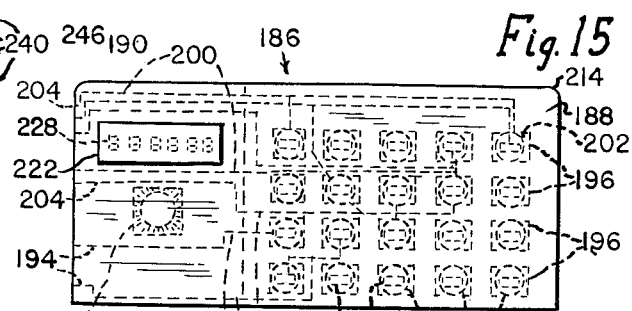
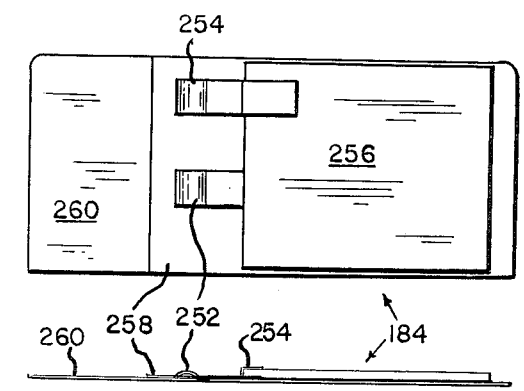
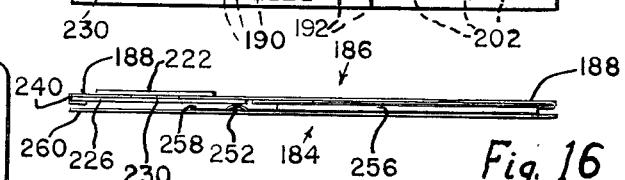
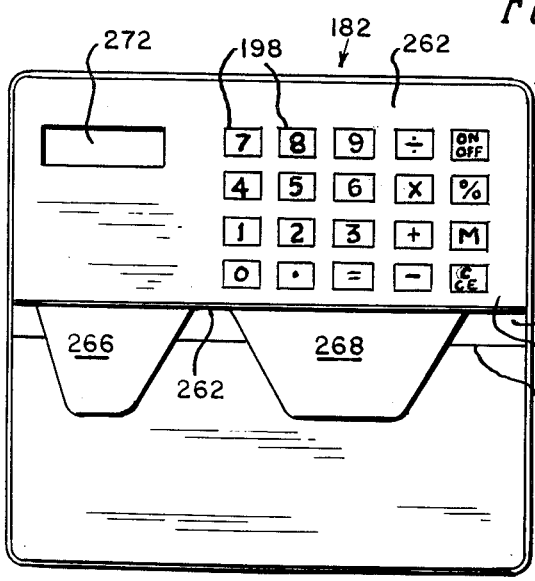
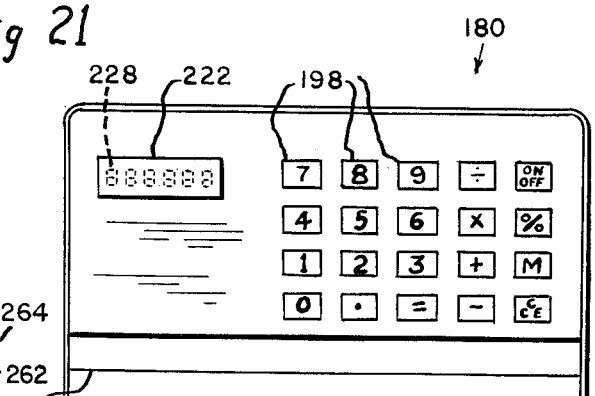

THIN FLEXIBLE ELECTRONIC CALCULATOR

This is a continuation-in-part of application Ser. No. 555,075, filed Mar. 3, 1975 and which is now abandoned.

BACKGROUND OF THE INVENTION

This invention relates to electronic calculators of a size small enough to be held in one hand and still having a sufficiently large keyboard capable of convenient operation with the fingers of the other hand. Conventional calculators of this size are generally too unwieldy to be conveniently carried in one's pocket. Thus it is customary to supply with each purchase of such small finger operable calculator a case with a strap for hand carrying the instrument.

The unwieldiness for pocket carrying of such conventional small finger operable electronic calculators is due primarily to several undesirable inherent physical characteristics. One of these undesirable inherent physical characteristics for pocket carrying of such conventional small electronic calculators is that their structure requires a rigid body or housing for providing a protective enclosure for the electronic circuitry and to provide a rigid base for supporting the mechanical elements such as the finger operable keyboard, function switches, readout register, and battery storage. Such rigid housing lacks the capacity to conform to one's body contour at the pocket in which the calculator is carried and thus tends to irritate or chafe one's body at the point of contact with the calculator housing.

Another of the undesirable physical characteristics for pocket carrying of most of such small conventional electronic calculators is that to accomodate the bulk of conventional finger operable keyboards, function switches, batteries, and readout register, their thickness is generally about one inch or more which thereby produces an undesirable bulge to the pocket in which it is carried, a bulge which makes it particularly unsuitable for breast pocket storage.

A further undesirable physical characteristic for pocket carrying of most such conventional small finger operable calculators is that of their weight. The cumulative weight of the rigid housing, conventional finger operable keyboard, readout register, function switches, and particularly the conventional batteries which are generally of size AA for powering the calculator result in a total weight of about one half pound or more which is greater than is convenient or comfortable for carrying in one's pocket over an extended period of time.

While smaller and lighter electronic calculators do exist, they are generally too small for convenient operation in that the keyboard is too small for convenient finger operation and generally requires an instrument such as a stylus to reach individual keys. As a result, numbers, both on the individual keys and at the readout register, are generally too small for the average person to readily identify without the aid of a magnifying glass. Also to retain their diminutive size, miniature battery cells, such as used to power wrist watches, are used as the power source and result in an undesirably short operating life of such calculators.

The present invention constitutes a significant advance in the art in that the above undesirable physical characteristics of conventional small electronic calculators have been overcome in Applicants' present invention which achieves a finger operable calculator structure which lends itself to a body thickness as small as a mere five thirty seconds of an inch to thereby permit convenient storage in even a breast pocket without producing a disfiguring bulge. Besides lending itself to such desirably thin construction, Applicants' present invention achieves a calculator structure which has physical body flexibility sufficient to resiliently conform to body contour at the position of the pocket in which it is carried and to resiliently bend rather than break under bending moment loads while still maintaining sufficient stiffness and size of number and function keys and readout register numbers and symbols to achieve easy finger operation and visual indentification of individual keys and readout register numbers and symbols.

Also Applicants' present invention achieves a calculator structure which lends itself to very long operating life with a single battery, and is highly suitable for including as an integral part of a thin, flexible pocket folder with accompanhing note pad or checkbook or bank deposit and withdrawal memorandum pad to thereby make possible "on-the-spot" computation of such commonly encountered problems as market list cost and bank deposit, withdrawal and interest effect on principal. It also lends itself to unobtrusive inclusion as an additional page in a student's or business man's conventional note book or as part of the note book's cover for ready access in making computations of mathematical problems encountered in the classroom, laboratory or in business.

A primary object of the present invention is the provision of an electronic calculator structure which has a sufficiently large keyboard capable of convenient operation with one's fingers and yet small enough and thin enough to be stored in even one's breast pocket without producing a significant pocket bulge.

Another object of the present invention is the provision of a finger operable electronic calculator structure which has sufficient physical resilience to conform to body contour at the position of the pocket in which it is carried and to bend rather than break under accidental bending moments encountered in normal use and incorporates sufficient stiffness for easy finger operation of function and number keys and general manual handling of the instrument.

A further object is the provision of a finger operable electronic calculator structure which even with a battery is extremely light in weight and has a long battery operational life.

And another object is the provision of a finger operable electronic calculator structure which lends itself to incorporation in a thin flexible pocket folder with memorandum pad for "on-the-spot" computation of mathematical problems.

And a still further object is the provision of a finger operable electronic calculator structure which lends itself to unobtrusive inclusion as an additional page or in the cover of a permanently bound or loose leaf notebook for convenient "on-the-spot" computations as mathematical problems are encountered.

And a still further object is the provision of a finger operable electronic calculator which is extremely thin, light in weight and resiliently flexible, which may be comprised of inexpensive commercially available components with only slight physical alteration to achieve the present invention.

And another object is the provision of a very thin, flexible finger operable electronic calculator structure which lends itself to a wide variety of functional complexities, from simple addition and subtraction to complex mathematical operations and memory storage and retrieval functions.

SUMMARY OF THE INVENTION

An electronic calculator in accordance with the present invention includes a solid state computing and driving elements, readout register, number and function keys, battery, and a printed circuit providing the electrical coupling therebetween, the solid state computing and driving elements being in a form commercially as dual-inline elements or alternatively combined in the form of a single Mini-Pak chip, the function keys being in the form of low-profile flexible diaphram switches, the battery being in the form of a flexible flat member in the P-70 Rayovac class, the readout register being in the form of light emission diodes or liquid crystal display for digital character readout, and the printed circuit being comprised of a thin flexible dielectric material base carrying electrical conductors of sufficient flexibility to withstand the flexure of said base and electrically coupled to the computing and driving elements, flexible diaphram switches, battery and digital readout register in manner to form a thin, flexible finger operable calculator.

The low profile flexible diaphram switches are comprised of a thin flexible dielectric material with electrically conductive elements thereon or alternatively a thin flexible conductive elastomer, such as electrically conductive rubber, arranged for carrying identification numbers and function symbols on one face thereof with each number and symbol aligned with and above corresponding printed circuit input terminals in manner to effect the closing of such corresponding input circuit when contacted by the associated electrically conductive element or elastomer. A thin dielectric material separator with openings aligned with the respective numbers and symbols is interposed between the electrically conductive elements or the conductive elastomer and corresponding printed circuit input terminals to prevent such circuit closings except when finger pressure is applied to the electrically conductive element or the conductive elastomer at the respective numbers and symbols carried on its upper face.

In the illustrative embodiments, one portion of the thin flexible dielectric material base of the printed circuit is used to form the separator. In the conductive elastomer embodiment a separate dielectric material base of less flexible material carries the input printed circuit terminals thereon and electrically coupled to the printed circuit on the thin flexible dielectric material base to which it is also physically coupled for providing a suitable lead receiving base for finger pressure at the respective numbers and symbols carried on the upper face of the conductive elastomer for thereby simplifying finger operation of the respective number and symbol keys with the fingers of one hand while the physical calculator is held in the other hand. In the thin dielectric material with electrically conductive elements embodiment, a portion of the printed circuit base carries the input printed circuit terminals thereon electrically coupled to the printed circuit on the thin flexible dielectric material base, and is carried on the flat P-70 Rayovac class battery pack for providing a suitable load receiving base for finger pressure at the respective numbers and function symbols to thereby achieve further reduction in space requirements for components and achieve larger finger keying switch areas for easier keying operation.

By mounting the digital readout light emitting diodes, usually referred to as LEDs, as separate entities directly to the thin flexible dielectric material printed circuit base, flexure of the base at the digital readout LEDs may occur without injury to the LED structure. By placing a flexible dielectric material spacer between the LEDs and the flexible printed circuit base, the top digital readout face of the LEDs may be suitably raised to a level even with the keyboard face for convenient display of both the keyboard and the digital readout register. By placing the digital readout register sufficiently close to the keyboard to make the readout register visible simultaneously with the keyboard numbers and symbols, a keyboard without tactile feedback such as in Applicants' illustrative embodiments is advantageously used for its simple structure, low profile and low cost characteristics. By covering the irregularities and filling the voids of the structure with a flexible potting compound such as silicon rubber in manner to present a smooth top and bottom and side surfaces, the structural components are desirably protected and the calculator flexibility preserved as well as providing a calculator structure in suitable form for many useful end product applications.

One of Applicants' illustrative novel and useful end product embodiments is that of a pocket size folder, one side of which provides a housing for the calculator structure and the other side of the pocket size folder carries a suitable notation arrangement such as a paper pad or bank deposit and withdrawal recording pad or check book, on-the-spot mathematical calculations become a reality.

By providing in the calculator structure an ON-OFF switch having a member which in the switch ON position projects outwardly to obstruct closing of the folder, thereby provides a reminder to turn the switch to the OFF position before closing the folder to prevent battery discharge when the calculator is not in use. By providing a manually separable locking structure, such as Velcro or Ziplock at the battery position in the folder housing, battery replacement is facilitated. By combining the flexible dielectric material readout register spacer with the ON-OFF switch structure, a relatively simple arrangement for anchoring both the switch and dielectric spacer in place in the electronic calculator assembly is thereby achieved. By positioning the readout register and keyboard in manner that numbers and symbols are perpendicular to a side edge as distinguished from the top edge of the folder, convience in operation with recording pads having provision for similarly oriented entrees, such as is customary in bank deposit and withdrawal forms and check books, is thereby achieved. By housing the present thin, flexible electronic calculator structure in a loose leaf page or the cover of a conventional notebook, novel end product which is particularly useful to students, engineers, scientists and business men for on-the-spot mathematical computations is thereby achieved.

Further reduction in cost and thickness of the calculator structure is achieved by depositing the light emitting diode components on a separate dielectric member which also carries a combined computing and driver Mini-Pak chip and a printed circuit coupling to the light emitting diode components and the printed circuit on the thin dielectric material base, and making the low profile flexible diaphram switches from a folded extension of the thin flexible dielectric material base and arranged to be carried on a thin flat battery pack of the P-70 Reyovac class. By making the battery pack as a separate assembly from the combined readout register and low profile switching assembly, an economical and versatile modular arrangement is achieved for easy assembly with a flexible folder type housing as well as adaptability for different end products with a minimum inventory of modular components.

DESCRIPTION OF THE DRAWINGS

The features of the invention which are believed to be novel are set forth with particularity in the appended claims. The invention, together with the features, objects and advantages of the present invention will be better understood from the following description in conjunction with the accompanying drawings in which like reference numbers identify like components and in which:

FIG. 1 is a plan view of one embodiment of a thin flexible electronic calculator structure in accordance with the present invention;

FIG. 2 is a plan view of an open folder which houses the FIG. 1 electronic calculator structure in one of its cover sides and a pad of paper fixed to the other of its cover sides to form an end use product in accordance with the present invention;

FIG. 3 is a cross sectional view of the FIG. 1 calculator structure taken on line 3—3 of FIG. 1 and a cross section view of the FIG. 2 folder housing taken on line 3—3 of FIG. 2;

FIG. 4 is a plan view of a segmentary portion of the FIG. 3 illustration with the battery and portion of the housing cover removed to more clearly show construction;

FIG. 5 is a cross section veiw of the FIG. 4 segmentary portion taken on line 5—5 of FIG. 4;

FIG. 6 is an end view of the FIG. 2 embodiment;

FIG. 7 is an end view of the FIG. 2 embodiment showing the folder sides in closed position for convenient storage in a breast pocket or other pocket;

FIG. 8 is a plan view to enlarged scale of a combined ON-OFF switch and dielectric spacer for the readout register of the FIG. 1 illustrative embodiment;

FIG. 9 is a side view of the FIG. 8 illustration;

FIG. 10 is a bottom view of the combined ON-OFF switch and dielectric spacer illustrated in FIG. 8;

FIG. 15 is a plan view of a third embodiment of a thin flexible calculator structure in accordance with the present invention;

FIG. 16 is a front view of the FIG. 15 embodiment;

FIG. 17 is a plan view of a thin flexible dielectric material base used in the FIG. 16 embodiment;

FIG. 18 is a plan view of a separate dielectric member carrying a combined computing and driver chip and a digital readout register for use in the FIG. 15 embodiment;

FIG. 19 is a view of the back side of the FIG. 18 separate dielectric material member showing a printed circuit for electrically coupling the computing and driver chip and readout register to the printed circuit in the FIG. 15 embodiment;

FIG. 20 is a plan view of a thin flat battery pack used in the FIG. 15 embodiment;

FIG. 21 is a front view of the FIG. 20 battery pack;

FIG. 22 is a plan view of a flexible folder type housing structure for the FIG. 15 electronic calculator structure;

FIG. 23 is a plan view of a portion of the FIG. 21 structure with the FIG. 15 calculator structure housed therein;

FIG. 24 is an end view to enlarged scale of the FIG. 23 illustration showing the folder sides in closed position for convenient storage in a breast or other pocket.

DESCRIPTION OF THE ILLUSTRATED EMBODIMENTS

Figure 11:
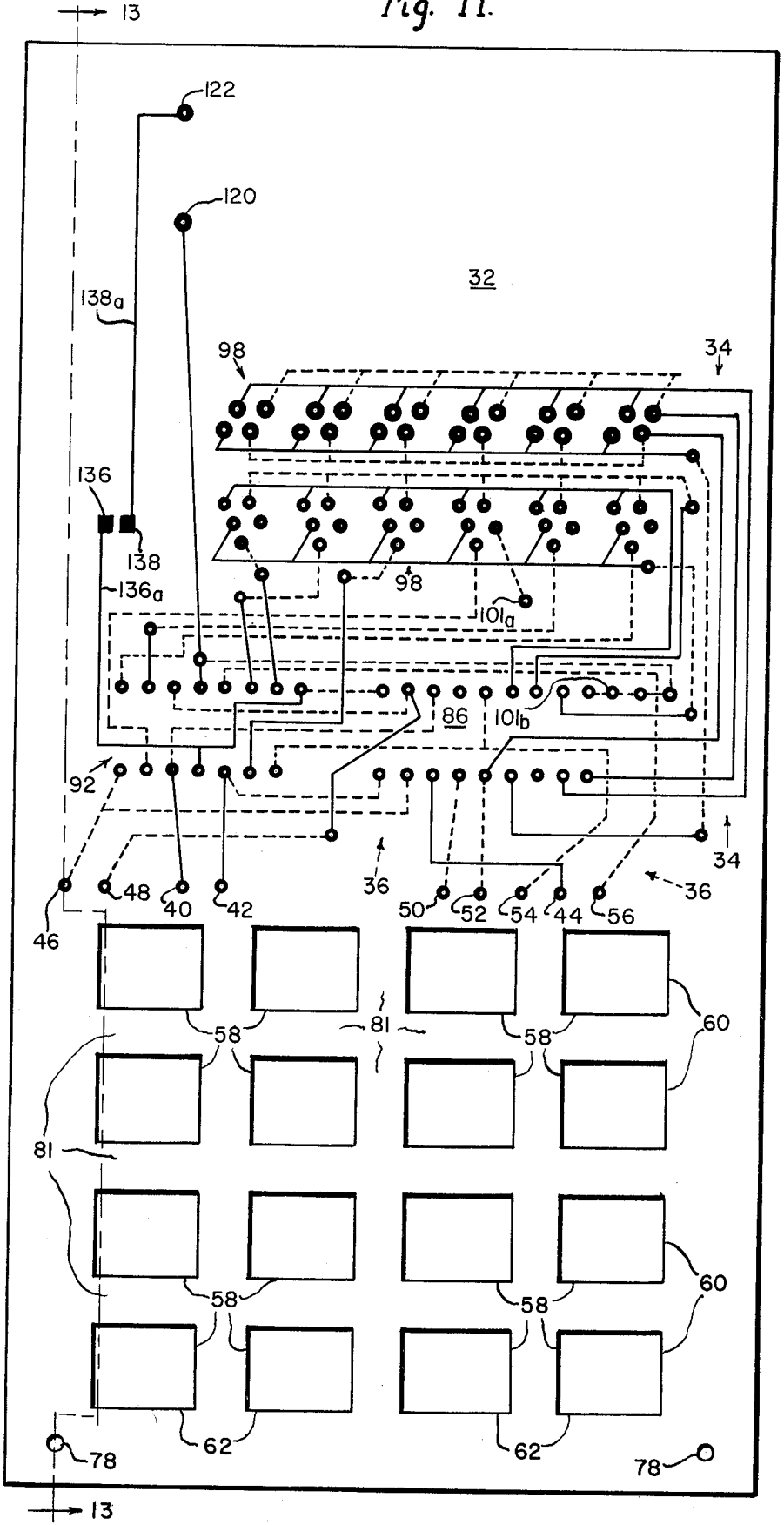
FIG. 11 is a plan view to enlarged scale of a flexible printed circuit for use in the FIG. 1 embodiment and including keyboard openings spaced for alignment with the keyboard numbers and symbols and with the lands about the openings forming a dielectric separator for the keyboard conductive elastomer.

A thin, flexible electronic calculator structure in accordance with the present invention is designated generally by the number 30 in FIG. 1. The thin, flexible electronic calculator structure 30 has a flexible dielectric film or membrane 32 (FIGS. 1, 3, 11 and 13) of such dielectric material as polyester, polyimide, tetraflouroethylene, polyethyline or polyvinyl chloride. Fixed to the upper surface or face of the flexible dielectric film 32 are electrical conductors shown schematically by solid lines in FIG. 11 to form what is generally known as a flexible printed circuit 34. Similarly on the bottom surface or face of the flexible dielectric film 32 is another flexible printed circuit 36 shown schematically in broken lines in FIG. 11. The flexible dielectric film or membrane 32 prevents electrical engagement between the electrical conductors of the printed circuits 34 and 36 except as some of the terminal positions as shown in FIG. 11 and to be hereinafter further described. Both of the printed circuits 34 and 36 on the respective top and bottom faces of the dielectric membrance 32 are shown in the single FIG. 11 illustration because their respective relationship is more easily visible than if shown in separate figures. All of the terminals in the printed circuits 34 and 36 are shown in FIG. 11 as circular areas, each with a centrally located hole whose wall carries electrically conductive material so that the conductors of the respective printed circuits pass through the dielectric material 32 at the respective terminals to enable the making of electrical contact from both the top and bottom faces of the dielectric material 32. For example, terminals 40, 42 and 44 of respective conductors of printed circuit 34 on the top face of the flexible dielectric film 32 also pass through to the bottom face of the flexible dielectric film 32. Conversely terminals 46, 48, 50, 52, 54 and 56 for the respective conductors of printed circuit 36 on the bottom face of the flexible dielectric film 32 pass through to the top face of the flexible dielectric film 32.

The flexible dielectric film or membrane 32 also has at its lower end sixteen rectangular openings 58 arranged in four rows 60 and four columns 62 with each row and each column containing four of the rectangular openings 58.

Figure 12:
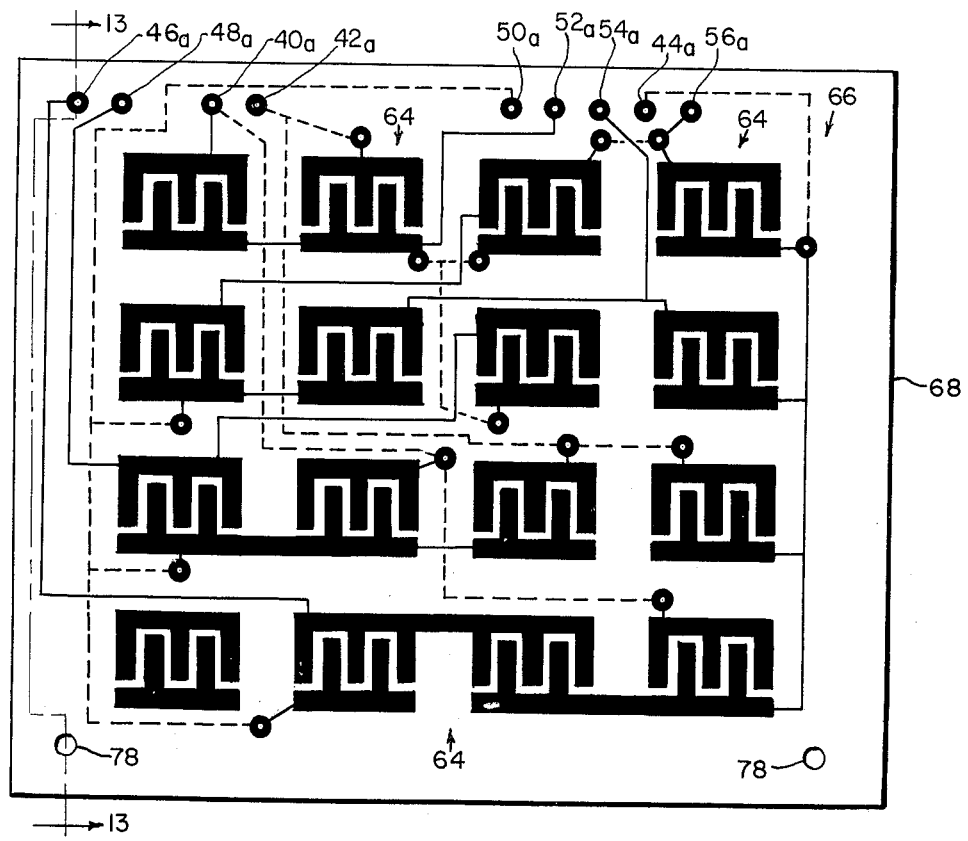
FIG. 12 is a plan view of a printed circuit to the same scale as that of FIG. 11 showing electrical conductors spaced to align with respective keyboard openings of the FIG. 11 illustration.

Aligned with each of the rectangular openings 58 is a corresponding keying terminal matrix 64 in a keyboard printed circuit 66 on the top surface or face of a keyboard base 68 of dielectric material which may be of the same material as that of the flexible dielectric film 32 except in that it is thicker and therefor less flexible than the dielectric film 32 in order to provide sufficient stiffness for proper keyboard operation under finger pressure as will be hereinafter further explained. The bottom surface or face of the dielectric keyboard base 68 also has printed circuit 70 electrical conductors which are shown by broken lines in FIG. 12 and which make electrical engagement with the keyboard printed circuit 66 on the top face of the dielectric keyboard case 68 only at the respective terminals shown in FIG. 12.

Figure 13:
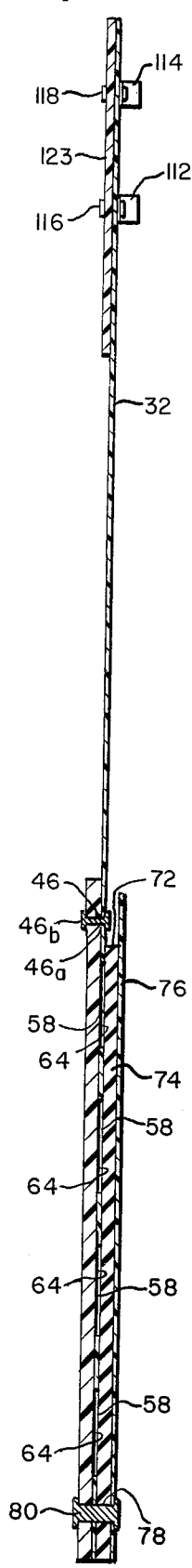
FIG. 13 is a cross sectional view to enlarged scale taken on line 13—13 of FIG. 11 and including a cross sectional view of the FIG. 12 structure, the conductive elastomer and keyboard indicia sheet fastened thereto at the keyboard end and the dielectric backup sheet for the battery and battery terminals fastened thereto at the battery end of the flexible printed circuit base.

The terminals have a centrally located hole through the dielectric keyboard base 68 and its wall carries electrically conductive material so that the conductors of the respective printed circuit pass through the dielectric keyboard base 68 at the respective terminal to enable the making of electrical contact on both the top and bottom faces of the dielectric keyboard base 68. For example, terminals 40a, 46a, 48a, 52a, and 56a of respective conductors of the printed circuit 66 on the top face of the dielectric keyboard base 68 also pass through to the bottom face of the dielectric keyboard base 68. Conversely, terminals 42a, 50a and 44a for respective conductors on the bottom face of the dielectric keyboard base 68 pass through to the top face of the dielectric keyboard base 68. The spacing and positioning of the terminals 40a through 50a are such that when the top face of the dielectric keyboard base 68 is placed against the bottom face of the flexible dielectric film 32 the holes through the respective terminals 40a through 56a may be aligned with the holes in the terminals 40 through 56 respectively in the flexible dielectric film 32. Thus when each of these respective terminals such as 46 and 46a are fastened together by a rivet such as 46b as shown in FIG. 13 there will be electrical coupling between the associated conductors in the respective printed circuits 34, 36, 66 and 70 and the keying terminal matrices 64 will be aligned with the respective keyboard openings 58 in the flexible dielectric film 32.

On the top face of the flexible dielectric film 32 covering the rectangular openings 58 to a distance 72 (FIGS. 1, 3 and 13) below the terminals 40 through 56 is a flexible electrically conductive eleastomer diaphram 74 of such material as rubber impregnated with a conductive material such as finely divided silver or gold. Over the electrically conductive diaphram 74 is a thin flexible keyboard indicia sheet 76 of a flexible dielectric material and carrying out the numbers 0 through 9 and multiplication, subtraction, division, addition and equals function symbols together with a cancel symbol C as shown in FIG. 1, each of which being preferably circumscribed by a rectangle as shown in FIG. 1 and having a placement and size corresponding to an associated one of the openings 58 in the mounting film base 32 and fixed in place in alignment with such corresponding opening 58 by alignment rivets 80 (FIGS. 1, 3 and 13) in alignment holes 78.

The lands 81 of the flexible dielectric film 32 surrounding the rectangular openings 58 keep the conductive diaphram 74 from touching any of the printed circuit matrices 64 except when finger pressure is applied on a function symbol or number on the indicia sheet 76 whereupon the conductive diaphram at such point touches the matrix 64 directly beneath the finger pressure and closes the associated circuit.

A solid state, six digit, four function, binary digital calculating element 82 (FIGS. 1 and 3) packaged in a thin package similar to what is commercially known as a "dual in line" such as MM5736 available from National Semiconductor, Sunnyvale, California, has its 18 wire leads 84 projecting through and soldered in the associated pass-through holes of the 18 terminals 86 (FIG. 11) of the printed circuits 34 and 36. In similar manner, a solid state readout driver circuit 88 (FIG. 1) such as DM75492, also available from the above indentified National Semiconductor, has its 14 wire leads 90 projecting through and soldered in the associated pass-through holes of the associated terminals 92 (FIG. 11) of the printed circuits 34 and 36.

Six digital readout light emitting diodes 94 (FIGS. 1 & 2), sometimes herein called LEDs, such as MAN3M commercially available from Monsanto, Cupertino, Calif., with each LED 94 having nine wire leads 96 projecting through and soldered in the pass-through holes of respective associated terminals 98 (FIG. 13) of the printed circuits 34 and 36 form a six digit readout register display 100. A 174 watt 470 ohm resistor 101 (FIG. 1) is coupled to terminals 101a and 101b (FIG. 11) respectively to provide a circuit to light up a decimal point on the display 100 for a two decimal place readout. A display spacer 102 of dielectric material, which may be of material such as used in the flexible dielectric film 32, is placed between the flexible dielectric film 32 and the digital readout diodes 94 to raise the level of the top faces of the LEDs 94 to a suitable height such that the readout numbers will be visible above a flexible potting compound filler 104 (FIG. 3) such as of silicon rubber which fills all the vacant spaces between the end 72 of the conductive elastomer keyboard diaphram 74 to a six volt battery 106. In order to show positioning of components, the flexible filler 104 is not shown in FIG. 1, but it covers the digital calculating elements 82 and its wire leads 84, the driver element 88 and its wire leads 90, the display spacer 102, sides of the LEDs 94 and their wire leads 96 and all irregularities on the bottom face of the flexible film 32 such as from protrusion of wire leads and solder connections to thereby form a smooth surface on all sides and faces of the calculator assembly shown in FIG. 1 and leaving just sufficient space at the top end of the flexible dielectric film 32 to accommodate the battery 106. In FIG. 3 the flexible filler 104 is illustrated by small dots to, in this instance, appear sufficiently transparent to make visible structural components. However, a transulcent or opaque flexible filler 104 may also be used.

The battery 106 is thin and flexible of the P-70 class commercially available from the Rayovac Corporation, Madison, Wisconsin. The battery 106 is covered with a dielectric plastic except for two electrode surfaces 108 and 110 (FIG. 1) on the bottom face of the battery 106 and which make electrical engagement with spring electrical contact elements 112 and 114 (FIGS. 1, 4 and 5) respectively. The spring electrical contact elements 112 and 114 are preferably of such electrically conductive material as berylium copper and are each fixed at one end by rivets 116 and 118 respectively to terminals 120 and 122 respectively of the printed circuit 34 (FIG. 11).

A dielectric plastic reinforcing backup support 124 covering the same area as the battery 106 is also fixed with the rivets 116 and 118 to the bottom face of the flexible dielectric film 32 to provide added support for the spring contact elements 112 and 114 to insure good electrical contact with the battery electrodes 108 and 110.

The display spacer 102 is a stem emanating from a hand operable rotary switch 124 having a circular shaped support 126 to the inside of which is fixed by screw 128 a ratchet spring 130 positioned to engage a groove 132 and hold a lever 133 in place in switch "ON" position when an electrically conductive spring wiper 134 is in electrical engagement with the terminals 136 and 138 (FIGS. 10 and 11) of battery conductors 136a and 138a in the printed circuit 34 so as to close the circuit at the terminals 136 and 138 to the battery 106. Such circuit closing occurs when the switch lever 133 is in the position shown by solid lines in FIG. 8. When the switch lever 133 is moved to the position shown by broken lines in FIG. 8 and by solid lines in FIG. 10, the electrically conductive spring wiper 134 will be disengaged from the terminals 136 and 138, effecting an open circuit to the battery 106, and the ratchet spring 130 will engage groove 140 as shown in FIG. 10 to hold the lever 133 in the open circuit or "OFF" position.

A pivot post 142 fixes the switch lever 133 to the flexible dielectric film 32 and provides the fulcrum about which the lever 133 may be rotated to the switch "ON" and "OFF" positions described above.

The FIG. 1 electronic calculator structure 30 to which has been added the flexible potting compound 104 as explained above provides a thin (in the order of five thirty seconds of an inch), flexible calculator structure suitable for incorporation in many novel and useful end products. One of such novel and useful end products is a pocket folder type pad and calculator combination 144 shown in FIGS. 2 through 8. In the folder 144 embodiment, the electronic calculator structure 30 is housed in the right side of the folder 144 between two layers 146 and 148 (FIGS. 1, 3, 6 & 7) of any suitable material such as flexible viny or other plastic or leather or even paper compositions. The two layers 146 and 148 are cemented or fused together about the edges 150 up to the portion occupied by the battery 106. The portion of the edges adjacent three sides of the battery 106 have fixed thereto a suitable manually separable locking arrangement 152 such as Velcro, Ziploc, or conventional Zipper fastener to provide an arrangement for replacing the battery 106 as needed.

The material layer 146 covering the upper face of the electronic calculator assembly 30 has an opening 154 for exposing to view the display of the digital readout register 100 and may include a thin transparent, flexible plastic window for ease in cleaning for maximum readability of the output of the digital display 100. Also, at the left side of the material layer 146 is an elongated opening 156 to permit movement of the ON-OFF switch lever 133 to the positions shown in solid and broken lines in FIG. 2. Additionally, the material 146 has 16 rectangular openings 158 arranged in four rows and four columns coinciding with and making visible the rows and columns of numbers and function indicia of the electronic calculator assembly 30.

The left side of the folder 144 has a conventional paper pad 160 with its stiffener back inserted in a pocket opening 162. The folder 144 may also have another pocket opening 164 for a type of pad which may be anchored there.

The readout register 100 has been placed between the battery 106 and the keyboard indicia to both provide an easy replacement access arrangement for the battery 106 and also to bring the readout register 100 conveniently close to the number and function keys to make both visible simultaneously or with minimum eye movement from one to the other during operation.

In the operation of the folder type pad and calculator combination 144, the ON-OFF switch lever 133 is moved from the OFF position shown by the broken lines in FIG. 2 to the ON position shown by the solid lines 133 in FIG. 2 which as explained above in connection with FIG. 10 closes the circuit to the battery 106. In this ON position, the switch lever 133 extends outwardly over the center fold of the folder 144 to thereby prevent closing of the left cover side of folder 144 over the housing membrane layer 146 as in FIG. 7 to thereby prevent inadvertent discharge of the battery 106 during storage of the calculator.

With the switch lever 133 in the ON position, addition, subtraction, multiplication and division functions may be performed in conventional manner of electronic calculators within the capacity of the 6 digit readout display 100 of the FIG. 2 embodiment. The calculating element 88 and driver being an MM5736 and a DM75492 respectively and the decimal lead 96 of the third LED 94 from the right hand side of display 100 being coupled through terminals 101a 101b and resistor 101 to the battery terminal 120 in the printed circuit arrangement in the present illustrative embodiment, the readout register 100 display will always be to the nearest two decimal places and particularly suitable for dollars and cents computations. For example, to add the amounts $4.12 and $.03, finger pressure is momentarily applied sequentially to the keyboard numbers 4, 1 and 2, and then to the function ± key, after which finger pressure is momentarily applied to the keyboard number 3 followed by ± function key again and the answer 4.15 will appear in the three LEDs at the right hand side of the digital readout display 100. If the $.03 were to be subtracted from the $4.12, the finger pressure would have been momentarily applied to the = function key instead of the ± key after entry of the $.03 and thereupon the answer 4.09 would appear in the LEDs 94 at the right hand side of the readout register display 100. If the 4.12 were to be multiplied by 0.03, finger pressure would be momentarily applied to the x function key before applying finger pressure to the keyboard number 3 and followed by momentary finger pressure on the ± function key to obtain the positive answer to the second decimal place as .12 displayed on the two LEDs 94 at the right hand side of the readout register 100. If the 4.12 were to be divided by the 0.03, finger pressure would be momentarily applied to the ÷ function key before applying finger pressure to the keyboard number 3 and followed by momentary finger pressure on the ± function key to obtain the answer to the second decimal place as 1.37 displayed on the readout register 100. Clearing the calculator for commencement of a new computation is effected by momentary finger pressure on the key labelled C.

In the FIGS. 1 and 2 embodiment the lower left hand corner key 166 is left blank and not used in this most simplified and economical embodiment of applicant's invention to make it particularly adapted for such common uses as check book balance and shopping list calculations.

Figure 14:
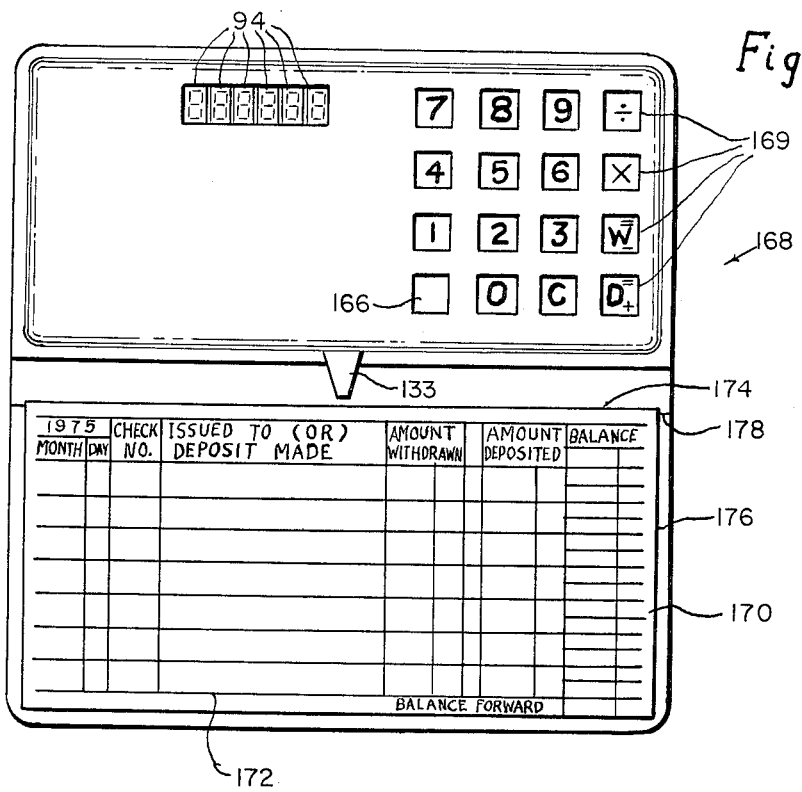
FIG. 14 is a plan view of a second embodiment of the invention.

A second embodiment of the thin flexible folder type calculator invention is illustrated in FIG. 14 and designated generally by the numeral 168. The thin flexible folder type calculator 168 is comprised of components like those described in connection with the folder type calculator 144 but oriented to effect a change in location and orientation of the digital readout diode chips 94 and the rows 169 of the number and function keys to thereby increase convenience of use with business forms such as check books and bank deposit and withdrawal forms. One such business form is the deposit and withdrawal record form pad 170 whose recording lines 172 are parallel to its length dimension 174 as distinguished from its shorter or width dimension 176 and has its back stiffener in pocket opening 178 running lengthwise of the folder type calculator 168. The number and function key rows 169 and digital readout diode chips 94 in FIG. 14 are positioned to be parallel to the length dimension 174 to thereby permit both operation of the calculator and the making of entries on the record form 170 without reorienting the position of the folder type calculator 168 as would be necessary with the folder type calculator 144 if the business fform 170 were held in the pocket opening 164.

An additional convenience may be provided by adding a D to identify the $\pm$ key as a deposit function key and adding a W to identify the | key as a withdrawal function key in the foler type calculator embodiment 168.

The operation of number and function keys and the ON-OFF switch lever 133 in the FIG. 14 embodiment is the same as that described above in connection with the FIG. 2 embodiment.

A third embodiment of a thin flexible calculator structure in accordance with the present invention is illustrated in FIGS. 15 through 24. The third embodiment is designated generally by the numeral 180 in FIG. 23 and it comprises of three basic modular components, namely, a flexible housing designated generally by the numeral 182 in FIG. 22; a thin flat battery pack designated generally by the numeral 184 in FIGS. 16, 20 and 21; and a thin flexible keying, computing and digital readout assembly designated generally by the numeral 186 in FIGS. 15 and 16.

The thin flexible keying, computing and digital readout assembly 186 has a thin flexible membrane or film base 188 of dielectric material such as the material in the thin flexible dielectric material base 32. The thin flexible dielectric material base 188 has on one face thereof flexible printed circuit elecrical conductors 190 electrically coupling each of the associated ones of electrically conductive printed circuit keying terminals 192 to corresponding terminal positions 194 at the right hand end of the flexible dielectric material base 188. Only a few of the keying terminals 192 are shown coupled by electric circuit conductors 190 to the corresponding terminal positions 194 to merely illustrate the principle involved in the present embodiment inasmuch as the general circuitry has been illustrated in more detail in connection with the FIG. 1 embodiment and is determined by the particular computing, driver and readout register elements involved. Each of the keying terminals 192 is circumscribed by a line 196 forming a rectangle corresponding in size and placement with similar rectangles 198 on the housing 182 in FIGS. 22 and 23 carrying number and function indicia as will be hereinafter further described. The rectangles 196 are merely indications to facilitate location of the respective terminals 192 and may be eliminated where manufacturing tooling otherwise accurately locates the terminals 192.

Other flexible printed circuit electrical conductors 200 on the face of the dielectric material base 188 electrically couple associated electrically conductive switching terminal members 202 to corresponding terminal member positions 204 at the right hand end of the flexible dielectric material base 188. Only a few of the electrically conductive switching terminal members 202 are shown coupled by printed circuit conductors 200 to the corresponding terminal member positions 204 to illustrate the structural principle, but it should be understood that, as with the keying terminals 192, other of the switching terminal members 202 are similarly electrically coupled to corresponding terminal member positions at the right hand end of the flexible dielectric material base 188.

The left hand side of the flexible dielectric material base 188 forms a dielectric spacer 206 having spacer openings 206 positioned in a manner such that when the dielectric spacer 206 is folded inwardly at spacer fold line 210 onto the terminal members 202, the dielectric spacer openings 208 will each be over a corresponding switching terminal member 202 and the radius 212 at the upper left of the dielectric spacer 206 will coincide with the radius 214 at the upper right of the switching terminal members 202. By a further folding at the fold line 216 there will be formed thereby a low profile number and function key switching arrangement wherein the portion of the flexible base 188 carrying the keying terminals 192 forms a bottom layer; the dielectric material spacer 206 forms an intermediate layer having an opening 208 over corresponding ones of the keying terminals 192 and the portion of the base 188 carrying terminal members 202 forms the top layer with each of the switching terminal members 202 being spaced from the keying terminals 192 by the dielectric spacer 206, one above the other as shown by broken lines in FIG. 15 and subject to being placed in contact with each other by finger pressure as will be hereinafter further described. With such three layer folding the radii 212 and 214 will coincide with the radius 218 at the upper left of the keying terminals 192.

The thin flexible dielectric material base 188 has a rectangular opening 220 for permitting a light control film lens 222 such as available from the 3M Company, St. Paul, Minnesota to protrude therethrough when the top face 224 of a separate printed circuit member 226 to which it is mounted rests against the flexible dielectric base 188 as shown in FIG. 15. The light control film lense also preferably has integral therewith a color filter which together with its magnifying capability makes clearly visible the indicia 228 from light emitting diodes on the face 224 of the separarate printed circuit member 226.

Also mounted on the top face 225 of the separate printed circuit member 226 is a combined computing and driver chip 230 such as available under the name Mini-Pak from General Instrument Corporation, Hicksville, N.Y. The combined computing and driver chip 230 has electrically conductive leads 232 projecting through to the bottom side 234 of the printed circuit member 226 and making electrical engagement with the printed circuit conductors 236 on the bottom side 234. Some of the printed circuit electrical conductors 236 are coupled through pass-through terminals 238 to the light emitting diodes for effecting the readout register indicia 222. Others of the printed circuit conductors 236 provide electrical coupling to corresponding terminal positions 240 for electrical coupling by soldering or other suitable means to the corresponding terminal positions 194 and 204 on the flexible dielectric material base 188. Such coupling permits the thin flexible material base 188 to wrap around the edge of the printed circuit member 226 as shown at 242 in FIG. 15 wherein the flexible material base then covers the top face 224 of the printed circuit members 226 leaving the readout register indicia 222 clearly visible through opening 220 of the thin flexible material base 188. In such assembly the radius 224 of the printed circuit member 226 coincides with the radius 246 of the thin flexible base 188.

Also, two of the printed circuit conductors 236 provide electrical coupling to two terminals 248 and 250 for engagement with spring terminal contacts 252 and 254 of a thin flat battery 256 such as available from the above mentioned Rayovac Corporation.

The thin flat battery 256 with its spring terminal contacts 252 and 254 rest upon a thin dielectric sheet 258 which with the battery 256 fixed to a thin dielectric support or back-up member 260 by cementing or by dielectric tape or other suitable means (not shown) to form the battery pack 184. The battery pack 184 has the same peripheral shape and dimensions as that of the FIG. 15 thin flexible keying, computing and digital readout assembly 186. When the battery pack 184 is placed beneath the flexible keying, computing and digital readout assembly 186 as shown in FIG. 16, the spring battery terminal contacts 252 and 254 will make electrical engagement with the electrical terminals 242 and 244 respectively and the battery 256 is beneath and in supporting relation to the three layer keying switch assembly.

The peripheral dimensions of a housing pouch formed between the top 262 and bottom 264 layers of the flexible housing module are carefully proportioned to receive and hold the battery pack module 184 and the keying, computing and digital readout assembly module 186 immovably together in the assembled positions shown in FIG. 16. This is inexpensively accomplished by providing flaps 266 and 268 at the edge 270 of the top layer 262 defining the housing pouch opening. The modules 184 and 186 may either separately or in the assembled form shown in FIG. 16 be inserted into the housing pouch through the opening 270 beneath the flaps 266 and 268, after which the flaps 266 and 268 are inserted beneath the battery pack module 184 into the housing pouch opening and hidden from view as appears in FIG. 23 and effectively maintain the modules 184 and 186 immovably in place against the walls of the housing pouch and in proper alignment with the number and function keying indicia appearing in the printed rectangles on the top layer 262 of the flexible housing module 182. An opening 272 having the same dimensions and relative placement as the opening 220 of the flexible base 188 is provided in the top layer 262 of the housing module 182 for receiving the light control film lense 222 so that the indicia from the readout register may be clearly visible during operation of the number and function keys in the FIG. 23 embodiment.

A pocket opening 274 similar to the pocket opening 178 in the FIG. 14 embodiment may be provided in the other side of the housing module 182 for accommodating a pad or business forms such as described in connection with the FIG. 14 embodiment and without which the folded housing module 182 with the modules 184 and 186 therein will appear from one end as shown in the enlarged scale FIG. 24 illustration ready for easy and convenient storage in a breast or other pocket.

The FIG. 23 embodiment carries a larger number of function keys over those described in connection with the FIGS. 1 and 14 embodiments and includes additionally a percent, memory, cancellation and decimal keys as well as an ON-OFF key, the circuitry and operation of which are well known in the electronic calculator art and in this instance made possible by modifying a computing driver chip 230 known as type number 683D and available from the aforementioned General Instrument Corporation.

The ON-OFF key in the FIG. 23 embodiment is in this instance used in place of the switching arrangement shown in FIGS. 8, 9 and 10 because of its inherent lower cost advantage.

In the operation of the FIG. 23 embodiment, finger pressure momentarily on the ON-OFF key closes the circuit to the battery 256 after which operation of the number and function keys is similar to that explained above in connection with the FIG. 1 embodiment with the additional advantage of availability of the memory key marked M, the percent key marked %, decimal key marked ., and a cancel key marked C, all of which are used in conventional manner.

The battery 256 being directly below the number and function keys provides a suitable load receiving base and support for finger pressure at the respective number and function keys to insure sufficient deflection of the associated terminal member 202 for good electrical engagement with the corresponding terminal 192 to effect the selected circuit operation and registration at the readout register 228. When the operation has been completed, the ON-OFF key is again momentarily depressed to open the circuit to the battery 256 to avoid battery drain during storage.

This invention is not limited to the specific details of construction and operation described herein as equivalents will suggest themselves to those skilled in the art. For example, while light emitting diodes known as LEDs have been used in the readout registers in the FIGS. 1, 14 and 23 embodiments, liquid crystal displays generally known as LCDs such as obtainable from the Hamlin Corporation, Lake Mill, Wisconsin may also be used for the digital readout registers. Also the modular construction herein shown makes possible the preparation of keying, computing and digital readout modules of different complexity for accomodating different computing needs and with a relatively small inventory of interchangeable modules supply a wide variety of customer needs.

What is claimed is:

1. In an electronic calculator of the type having in combination electronic computing elements with electrical conductor leads, a readout register with electrical conductor leads, number and function keys, battery, a printed circuit and an ON-OFF switch, the improvement wherein:

said printed circuit is comprised of a thin flexible dielectric material base carrying flexible printed circuit electrical conductors with terminals in substantially a single plane for receiving said electronic computing elements and readout register electrical conductor leads, means fixing said computing element and readout register electrical conductor leads to associated ones of said flexible printed circuit terminals in manner to make electrical engagement with said terminals and to firmly fix said computing elements and readout register to a face of said flexible dielectric material base to thereby create a flexible calculator structure whose maximum physical thickness is substantially the same at the thickness of said flexible printed circuit base plus the thickness of the thickest one of said computing elements and readout register, said number and function keys are in the form of low-profile conductive elastomer diaphram switches comprised of a flexible keying printed circuit means carrying a printed circuit coupled to said first mentioned printed circuit and carrying a keying printed circuit terminal for each of said number and function keys, a thin flexible dielectric spacer covering said last mentioned printed circuit and having an opening at each of said keying printed circuit terminals, a flexible electrically conductive elastomer covering said dielectric spacer, number and function indicia carried on said electrically conductive elastomer at each associated opening of said spacer, and means fixing said keying printed circuit, spacer, elastomer and number and function indicia together in proper alignment of keying terminals, spacer openings and indicia for effecting electrical engagment between said conductive elastomer and keying terminal when finger pressure is applied to the associated indicia.

2. In an electronic calculator of the type having in combination electronic computing elements with electrical conductor leads, a readout register with electrical conductor leads, number and function keys, battery, a printed circuit and an ON-OFF switch, the improvement wherein:

said printed circuit is comprised of a thin flexible dielectric material base carrying flexible printed circuit electrical conductors with terminals for receiving said electronic computing elements and readout register electrical conductor leads, means fixing said computing element and readout register electrical conductor leads to associated ones of said flexible printed circuit terminals in manner to make electrical engagement with said terminals and to firmly fix said computing elements and readout register to a face of said flexible dielectric material base to thereby create a flexible calculator structure whose maximum physical thickness is substantially the same as the thickness of said flexible printed circuit base plus the thickness of the thickest one of said computing elements and readout register, said number and function keys are in the form of low-profile conductive elastomer diaphram switches comprised of a flexible keying printed circuit means carrying a printed circuit coupled to said first mentioned printed circuit and carrying a keying printed circuit terminal for each of said number and function keys, a thin flexible dielectric spacer covering said last mentioned printed circuit and having an opening at each of said keying printed circuit terminals, a flexible electrically conductive elastomer covering said dielectric spacer, number and function indicia carried on said electrically conductive elastomer at each associated opening of said spacer, means fixing said keying printed circuit, spacer, elastomer and number and function indicia together in proper alignment of keying terminals, spacer openings and indicia for effecting electrical engagement between said conductive elastomer and keying terminal when finger pressure is applied to the associated indicia, and said flexible keying printed circuit means includes means for providing less flexibility at said number and function keys than that of said first mentioned flexible printed circuit base to provide increased resistance to deflection under finger pressure on said indicia to insure operational electrical engagement between said conductive elastomer and keying terminal under normal finger pressure of one hand on the associated indicia even when said calculator structure is held in the other hand.

3. The combination as in claim 2 wherein said dielectric spacer is comprised of an extension of said thin flexible first mentioned printed circuit base, said means for providing less flexibility at said number and function keys is comprised of said keying printed circuit being carried on a dielectric base which is less flexible than said first mentioned printed circuit base, said keying printed circuit having pass-through terminals corresponding to associated pass-through terminals on said first mentioned printed circuit, and means electrically and physically coupling both said printed circuit bases together at said corresponding terminals.

4. The combination as in claim 3 wherein said readout register is comprised of a plurality of digital readout chips with each chip comprised of light emitting diodes and having electrically conductive leads fixed to said associated printed circuit terminals.

5. The combination as in claim 4 wherein said battery is of the P-70 Rayovac class.

6. The combination as in claim 5 wherein a flexible dielectric potting compound covers the computing elements, sides of the readout register and portions of the flexible printed circuit base to form a smooth surface to a level such that the indicia on the number and function keys and the readout portion of the readout register are visible at the surface level of said potting compound.

7. The combination as in claim 6 wherein said potting compound comprises silicon rubber.

8. The combination as in claim 6 wherein said flexible calculator structure is housed between two layers of thin flexible membrane to form a flexible housing with one of said layers having openings coinciding with and providing visibility of said readout register and said number and function indicia of said number and function keys.

9. The combination as in claim 8 wherein associated edges of the portion of said membrane layers housing said battery include a manually separable fastener structure for providing replacement access to said battery.

10. The combination as in claim 9 wherein said manually separable fastening structure is comprised of Velcro.

11. The combination as in claim 9 wherein said flexible housing has a flexible cover member coupled to one side of said housing with capacity for holding a pad and for folding over said one layer of housing membrane which has said openings to form a folder type thin flexible calculator combination.

12. The combination as in claim 11 wherein said ON-OFF switch has a member which projects outwardly over a portion of said foldable cover in the switch ON position to provide obstruction to folding of said cover over said housing and retracts in the switch OFF position to a nonobstructive position to the folding of said cover over said one layer of the calcultor housing.

13. The combination as in claim 12 wherein said housing has a length and width dimensions and said readout register and rows of number and function keys are perpendicular to said length dimension and said readout register is between said battery and said rows of numbers and function keys.

14. The combination as in claim 12 wherein said housing has a length and width dimensions and said readout register and rows of number and function keys are parallel to said length dimension.

15. The combination as in claim 12 wherein said calculating element is an MM5736, said readout register is comprised of six digital light emitting diode chips, and said flexible printed circuit provides the electrical coupling for operation as a four function six digit calculator.

16. In an electronic calculator of the type having in combination electronic computing elements with electrical conductor leads, a readout register with electrical conductor leads, number and function keys, battery, a printed circuit, and an ON-OFF switch, the improvement wherein:

said printed circuit is comprised of a thin flexible dielectric material base carrying flexible printed circuit electrical conductors arranged for electrically coupling to associated electronic computing element and readout register electrical conductor leads; means fixing said computing elements and readout register in a substantially single plane and electrically coupling computing element and readout register electrical conductor leads to the associated flexible printed circuit electrical conductors in manner to make electrical circuit with the associated electrical conductors; and said number and function keys are in the form of low-profile switches fixed to said dielectric material base and include a keying printed circuit electrically coupled to said first mentioned printed circuit and having a keying terminal for each of said number and function keys, a dielectric spacer on said keying printed circuit, said dielectric spacer having an opening at each of said keying terminals, on said dielectric spacer a flexible membrane carrying number and function indicia and electrically conductive material over and spaced from each of said keying terminals at the associated opening of said spacer, and means fixing said keying printed circuit, spacer and flexible membrane with the conductive material and indicia together in proper alignment of keying terminals for effecting electrical engagement between said conductive material and keying terminal when finger pressure is applied to the flexible membrane at the associated indicia.

17. In an electronic calculator of the type having in combination electronic computing elements with electrical conductor leads, a readout register with electrical conductor leads, number and function keys, battery, a printed circuit, and an ON-OFF switch, the improvement wherein:

said printed circuit is comprised of a thin flexible dielectric material base carrying flexible printed circuit electrical conductors arranged for electrically engaging associated electronic computing element and readout register electrical conductor leads; means fixing said computing element and readout register electrical conductor leads to the associated flexible printed circuit electrical conductors in manner to make electrical engagement with the associated electrical conductors; and said number and function keys are in the form of low-profile switches fixed to said dielectric material base and include a flexible keying printed circuit electrically coupled to said first mentioned printed circuit and having a keying terminal for each of said number and function keys, a dielectric spacer on said keying printed circuit, said dielectric spacer having an opening at each of said keying terminals, on said dielectric spacer a flexible membrane carrying number and function indicia and electrically conductive material over and spaced from each of said keying terminals at the associated opening of said spacer, means fixing and keying printed circuit, spacer and flexible membrane with the conductive material and indicia together in proper alignment of keying terminals for effecting electrical engagement between said conductive material and keying terminal when finger pressure is applied to the flexible membrane at the associated indicia, and said flexible keying printed circuit includes means for providing less flexiblity at said number and function keys than that of said flexible printed circuit base to provide increased resistance to deflection under finger pressure on said indicia to insure operational electrical engagement between said electrically conductive material and associated keying terminal under normal finger pressure of one hand on the associated indicia even when said electronic calculator is held in the other hand.

18. The combination as in claim 17 wherein said electronic calculator is housed between two layers of thin flexible membrane to form a flexible housing with one of said layers having openings coinciding with and providing visibility of said readout register and said number and function indicia of said number and function keys.

19. The combination as in claim 16 wherein said dielectric spacer is comprised from an extension of said thin flexible dielectric material base.

20. The combination as in claim 16 wherein said low-profile switches are comprised of three layers of thin flexible dielectric material forming a bottom layer, an intermediate layer and a top layer, said bottom layer having said keying printed circuit electrically coupled to said first mentioned printed circuit and having said keying terminal for each of said number and function keys, said intermediate layer being said dielectric spacer on said keying printed circuit and having said opening over each of said keying terminals, said top layer being said flexible membrane with electrically conductive material over and spaced from each of said keying terminals of the associated opening of said spacer and carrying a fourth flexible membrane with said number and function indicia over the associated openings of said spacer.

21. The combination as in claim 20 wherein said three layers of thin flexible dielectric material are comprised of a single sheet folded into said three layers, and said folds in said thin flexible dielectric material are included in said means for fixing said keying printed circuit, spacer and flexible membrane with conductive material together in proper alignment with said keying terminals.

22. The combination as in claim 21 wherein the thin dielectric material base carrying said flexible printed circuit and the flexible dielectric material of said low profile switches are comprised of a single sheet.

23. The combination as in claim 21 wherein said electronic calculator is housed between two layers of thin flexible membrane in the form of a flexible housing pocket, one of said two layers of flexible membrane being said fourth flexible membrane with number and function indicia over the associated openings of said spacer.

24. The combination as in claim 23 wherein a thin flat type battery pack is in said housing beneath said low profile switches for providing both electric power for said calculator and sufficient stiffness to said low profile switches to cause electric contact deflection of said conductive material of said top layer with the associated keying terminal of said bottom layer when finger pressure of one hand is applied at the associated number or function indicia of said fourth layer when said calculator is held in the palm of the other hand.

25. The combination as in claim 24 wherein said computing element, readout register and low-profile keys together with said thin flexible printed circuit base comprise one modular assembly; said battery pack a second modular assembly; and said housing a third modular assembly with said housing providing the means for holding said modular assemblies in proper working relation with respect to each other.

26. The combination as in claim 24 wherein said computing elements are in the form of a combined electronic driver and computing element chip having electrical conductor leads and said means fixing said readout register and combined driver and computing element chip electrical conductor leads to associated flexible printed circuit electrical conductors includes a separate printed circuit member of dielectric material of less flexibility than said flexible material base and carrying electrical conductors thereon in electrical engagement with corresponding leads of said readout register and combined electronic driver and computing element chip, said readout register and combined driver and computing element chip are mounted on said separate printed circuit member, said flexible printed circuit electrical conductors electrically engage associated ones of said electrical conductor leads on said separate dielectric printed circuit member thereby making said electrical circuit with associated conductors of said readout register and combined electronic driver and computing element chip, and said one layer of flexible housing membrane has an opening in alignment with said readout register for making said readout register visible in conjunction with said number and function indicia.

27. The combination as in claim 26 wherein a magnifying lense structure is mounted to form part of said readout register in said opening for both increasing visibility of readout register indications and protecting electronic elements in the readout register.

* * * * *